(12) United States Patent
Wang et al.

(10) Patent No.: US 10,325,993 B2
(45) Date of Patent: Jun. 18, 2019

(54) GATE ALL AROUND DEVICE AND FABRICATION THEREOF

(71) Applicant: TAIWAN SEMICONDUCTOR MANUFACTURING CO., LTD., Hsinchu (TW)

(72) Inventors: Yung-Chih Wang, Taoyuan (TW); Yu-Chieh Liao, Taoyuan (TW); Tai-I Yang, Hsinchu (TW); Hsin-Ping Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/719,301

(22) Filed: Sep. 28, 2017

(65) Prior Publication Data
US 2019/0097010 A1     Mar. 28, 2019

(51) Int. Cl.
*H01L 29/423*   (2006.01)
*H01L 29/66*    (2006.01)
*H01L 29/78*    (2006.01)
*H01L 29/06*    (2006.01)

(52) U.S. Cl.
CPC .... *H01L 29/42376* (2013.01); *H01L 29/0676* (2013.01); *H01L 29/42392* (2013.01); *H01L 29/66666* (2013.01); *H01L 29/7827* (2013.01)

(58) Field of Classification Search
CPC .................. H01L 29/0676; H01L 29/0673
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,362,354 B1 * | 6/2016 | Chang | H01L 29/0673 |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2011/0315950 A1 * | 12/2011 | Sleight | B82Y 10/00 257/9 |
| 2013/0168743 A1 * | 7/2013 | Dove | H01L 21/28114 257/288 |
| 2014/0077161 A1 * | 3/2014 | Duan | B82Y 10/00 257/29 |

(Continued)

OTHER PUBLICATIONS

Md Mash-Hud Iqbal, The Nanoscale Silicon Accumulation-Mode MOSFET—A Comprehensive Numerical Study, IEEE, Nov. 2008, pp. 14, vol. 55, No. 11.

(Continued)

*Primary Examiner* — Walter H Swanson
(74) *Attorney, Agent, or Firm* — Maschoff Brennan

(57) ABSTRACT

A device includes a nanowire, a gate dielectric layer and a gate electrode. The nanowire has a sidewall. The gate dielectric layer surrounds the nanowire. The gate electrode surrounds the gate dielectric layer and separated from the nanowire. The gate electrode comprises a sloped sidewall inclined with respect to the sidewall of the nanowire.

20 Claims, 11 Drawing Sheets

(56) References Cited

U.S. PATENT DOCUMENTS

| 2014/0166981 A1* | 6/2014 | Doyle | H01L 29/66666 |
| | | | 257/24 |
| 2014/0170821 A1* | 6/2014 | Nyhus | H01L 29/66666 |
| | | | 438/268 |
| 2015/0228775 A1* | 8/2015 | Yu | H01L 2/66666 |
| | | | 257/329 |
| 2016/0247938 A1* | 8/2016 | Masuoka | H01L 29/7827 |

OTHER PUBLICATIONS

S.B. Kang et al., "CVD-Cobalt for the Next Generation of Source/Drain Salicidation and Contact Silicidation in Novel MOS Device Structures with Complex Shape", IEEE (2003), IEDM 03, 501-504.

Atsushi Hori et al., "High Speed 0.1 µm Dual Gate CMOS with Low Energy Phosphorus/Boron Implantation and Cobalt Salicide", IEEE (1996), IEDM 96, 575-578.

Scott A. Wartenberg et al., "Substrate Voltage and Accumulation-Mode MOS Varactor Capacitance", IEEE vol. 52, No. 7, (2005), 1563-1567.

\* cited by examiner

GATE ALL AROUND DEVICE AND FABRICATION THEREOF

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, gate-all-around FETs were developed. The gate-all-around FETs are similar in concept to FETs except that the gate material surrounds the channel region on all sides.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
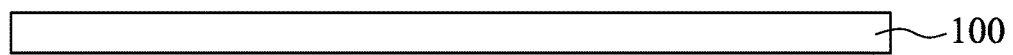
FIGS. 1-21 are cross-sectional views of a method of fabricating a device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-21 are cross-sectional views of a method of fabricating a device in accordance with some embodiments of the present disclosure. As illustrated in FIG. 1, the method begins by receiving a substrate 100. The substrate 100 can be any appropriate support structure, and can include a semiconductor substrate. In some embodiments, the substrate 100 is a semiconductor substrate, and in other embodiments, the substrate 100 includes a semiconductor substrate with various dielectric layers, e.g., inter-layer dielectric (ILD) layers and/or inter-metallization dielectric (IMD) layers, thereon. Some examples will be explained in more detail with reference to subsequent figures. A semiconductor substrate can be a bulk semiconductor substrate, a semiconductor-on-insulator (SOI) substrate, multi-layered or gradient substrates, or the like. The semiconductor of the semiconductor substrate may include any semiconductor material, such as elemental semiconductor like silicon, germanium, or the like; a compound or alloy semiconductor including SiC, GaAs, GaP, InP, InAs, indium antimonide, SiGe, GaAsP, AlInAs, AlGaAs, GaInAs, GaInP, and/or GaInAsP; the like; or combinations thereof. The semiconductor substrate may further be a wafer, for example.

Figure 2:
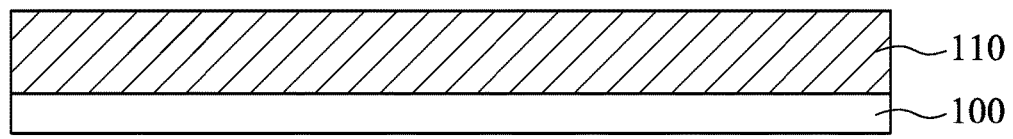

Reference is made to FIG. 2. A first conductive layer 110 is formed over the substrate 100 to form source/drain pickup regions in subsequent processes. The first conductive layer 110 can be any acceptable conductive material, and some embodiments contemplate that the first conductive layer 110 is metal, a metal-semiconductor compound, the like, or combinations thereof. Example metals include copper, gold, cobalt, titanium, aluminum, nickel, tungsten, titanium nitride (TiN), the like, or combinations thereof. Example metal-semiconductor compounds include nickel silicide (NiSi), titanium silicide (TiSi), tungsten silicide (WSi), cobalt silicide (CoSi), titanium germanide (TiGe), NiSiGe, NiGe, the like, or combinations thereof. The first conductive layer 110 can be formed by depositing a layer of conductive material on the underlying substrate 100. In some embodiments where the conductive material is metal, the metal can be deposited on the underlying substrate 100 by Physical Vapor Deposition (PVD), Atomic Layer Deposition (ALD), Chemical Vapor Deposition (CVD), the like, or combinations thereof. In some embodiments where the conductive material is a metal-semiconductor compound, a semiconductor material, such as silicon like polysilicon, polygermanium, or the like, can be deposited on the underlying substrate 100 by CVD, Plasma Enhanced CVD (PECVD), Low-Pressure CVD (LPCVD), evaporation, the like, or combinations thereof, and a metal can be deposited, such as discussed above, on the semiconductor material. An anneal process can then be performed to react the semiconductor material with the metal to form the semiconductor-metal compound.

Figure 3:
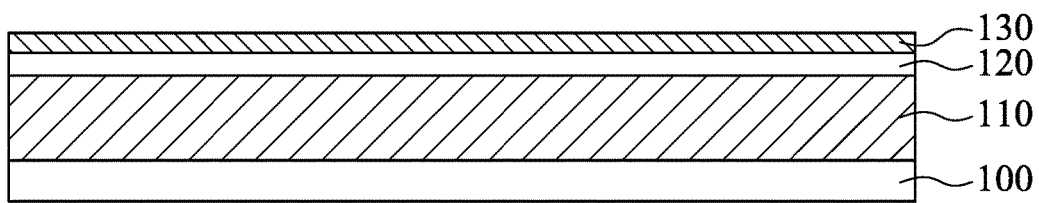

Reference is made to FIG. 3. A dielectric layer 120 is formed over the first conductive layer 110 and a second conductive layer 130 is then formed over the dielectric layer 120. Therefore, the first and second conductive layers 110 and 130 can be electrically isolated by the dielectric layer 120. In some embodiments, the dielectric layer 120 and the overlying second conductive layer 130 have different etch resistance properties. In some embodiments, the dielectric layer 120 is made of a material which has higher etch resistance to a subsequent etching process performed to the second conductive layer 130 than that of the second conductive layer 130. Therefore, the subsequent process performed to the second conductive layer 130 can be slowed down or even stopped by the dielectric layer 120, and hence the dielectric layer 120 can act as an etch stop layer (ESL) in the subsequent etching process. In some embodiments, the dielectric layer 120 includes aluminum oxynitride (AlON), aluminum oxide ($AlO_x$), oxygen-doped silicon carbide (SiC:O, also known as ODC), silicon nitride (SiN), the like, or combinations thereof. For example, the dielectric layer 120 may be an AlON layer with a thickness in a range from about 10 angstroms to about 20 angstroms, an ODC layer with a thickness in a range from about 10 angstroms to about 20 angstroms, or an $AlO_x$ layer with a thickness in a range from about 30 angstroms to about 50 angstroms, or the like.

The second conductive layer 130 can be any acceptable conductive material. In some embodiments, the second conductive layer 130 includes a conductive material the same as the first conductive layer 110. In other embodiments, the second conductive layer 130 includes a conductive material different from the first conductive layer 110. Some embodiments contemplate that the second conductive layer 130 is metal, a metal-semiconductor compound, the like, or combinations thereof. Example metals include copper, gold, cobalt, titanium, aluminum, nickel, tungsten, titanium nitride (TiN), the like, or combinations thereof. Example metal-semiconductor compounds include nickel silicide (NiSi), titanium silicide (TiSi), tungsten silicide (WSi), cobalt silicide (CoSi), titanium germanide (TiGe), NiSiGe, NiGe, the like, or combinations thereof. The second conductive layer 130 can be formed by depositing a layer of conductive material on the underlying dielectric layer 120. In some embodiments where the conductive material is metal, the metal can be deposited on the underlying dielectric layer 120 by PVD, ALD, CVD, the like, or combinations thereof. In some embodiments where the conductive material is a metal-semiconductor compound, a semiconductor material, such as silicon like polysilicon, polygermanium, or the like, can be deposited on the dielectric layer 120 by CVD, PECVD, LPCVD, evaporation, the like, or combinations thereof, and a metal can be deposited, such as discussed above, on the semiconductor material. An anneal can then be performed to react the semiconductor material with the metal to form the semiconductor-metal compound.

Figure 4:
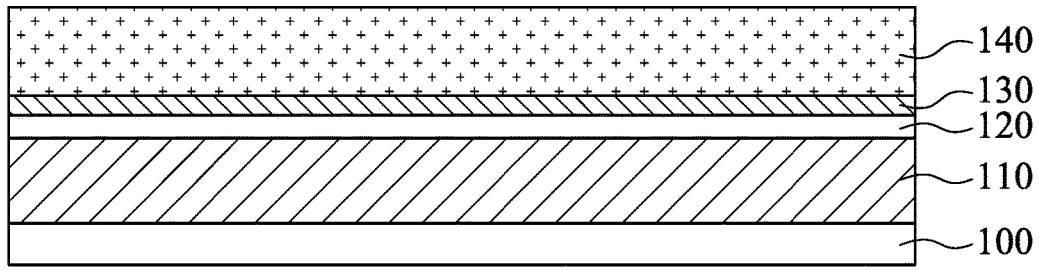

Reference is made to FIG. 4. A gate electrode layer 140 is formed over the second conductive layer 130. The gate electrode layer 140 can be any acceptable conductive material, such as a metal-containing material, a metal-semiconductor compound, doped semiconductor, the like, or combinations thereof. In the illustration, the gate electrode layer 140 is a doped semiconductor, such as an n-doped polysilicon or a p-doped polysilicon. In some embodiments, the gate electrode layer 140 is undoped polysilicon. In some embodiments, the gate electrode layer 140 is a metal-containing material, such as TiN, TaN, TaC, Co, Ru, Al, W, the like, or combinations thereof. The gate electrode layer 140 can be formed by depositing a layer of conductive material on the second conductive layer 130 by PVD, ALD, CVD, the like, or combinations thereof. As a result of the deposition, the gate electrode layer 140 is in contact with the second conductive layer 130, and they are thus electrically coupled or electrically connected to each other.

Figure 5:
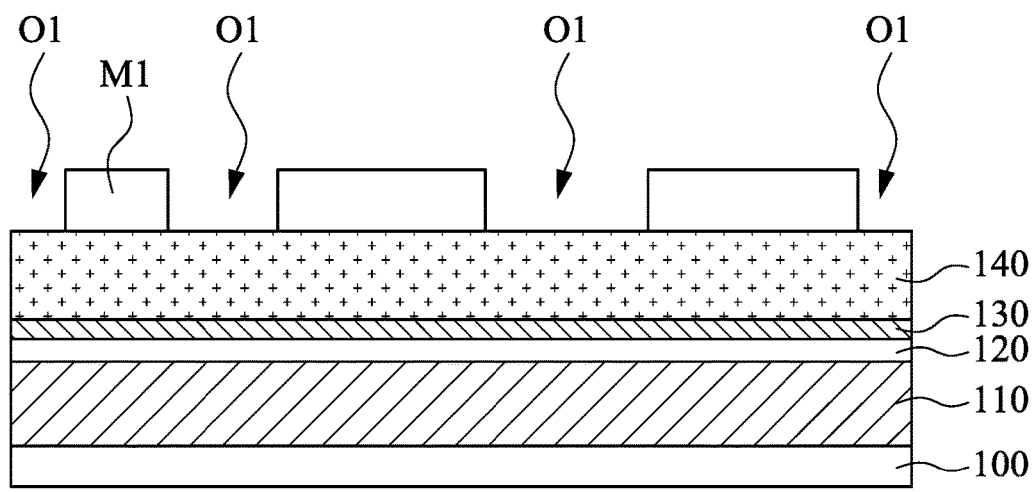

Reference is made to FIG. 5. A hard mask layer is formed over the gate electrode layer 140 and then patterned to form a hard mask M1 with openings O1 using suitable photolithography and etching processes, as example. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof, so as to form a patterned photoresist mask over the hard mask layer. After the photolithography process, the hard mask layer can be patterned using the patterned photoresist mask as an etch mask, so that the pattern of the patterned photoresist mask can be transferred to the hard mask M1. In some embodiments, the hard mask M1 is TiN, SiN, amorphous silicon, the like, or combinations thereof.

Figure 6:
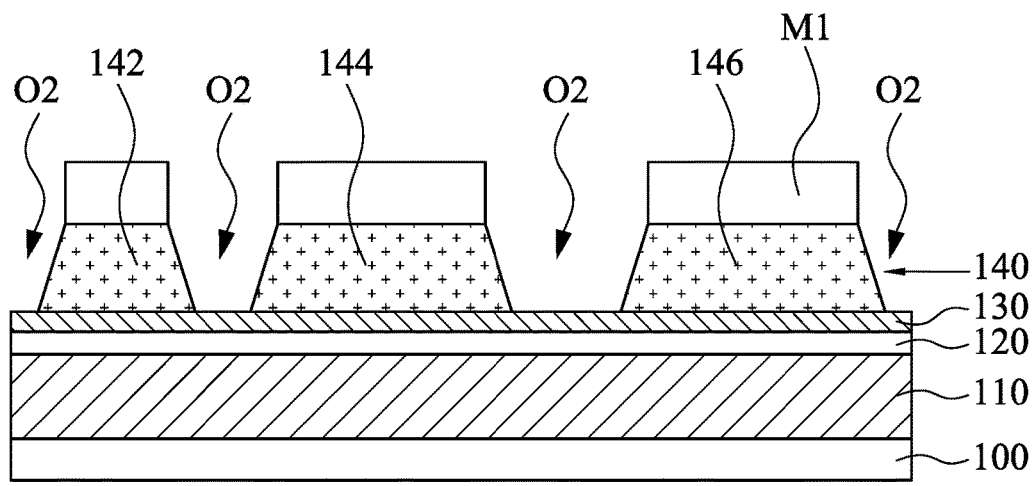

With the pattern of the hard mask M1 including the openings O1 is created, openings O2 corresponding to the openings O1 can be etched into the gate electrode layer 140, so that the gate electrode layer 140 can be patterned into a plurality of gate electrodes 142, 144 and 146 separated from each other. The resulting structure is illustrated in FIG. 6. Due to nature of etch operation, the openings O2 taper toward the underlying second conductive layer 130, thus creating gate electrodes 142, 144 and 146 in conical frustum shapes. Therefore, the gate electrodes 142, 144 and 146 can be referred to as conical frustum-shaped gate electrodes in some embodiments. In some embodiments, the gate electrode layer 140 is patterned by a suitable etching process, such as dry etching, wet etching or combinations thereof. In some embodiments, the dry etching process suitable for patterning the gate electrode layer 140 may use an etching gas such as $CF_4$, Ar, $NF_3$, $Cl_2$, He, HBr, $O_2$, $N_2$, $CH_3F$, $CH_4$, $CH_2F_2$, or combinations thereof. After patterning the gate electrode layer 140, portions of the second conductive layer 130 are exposed by the openings O2.

Figure 7:
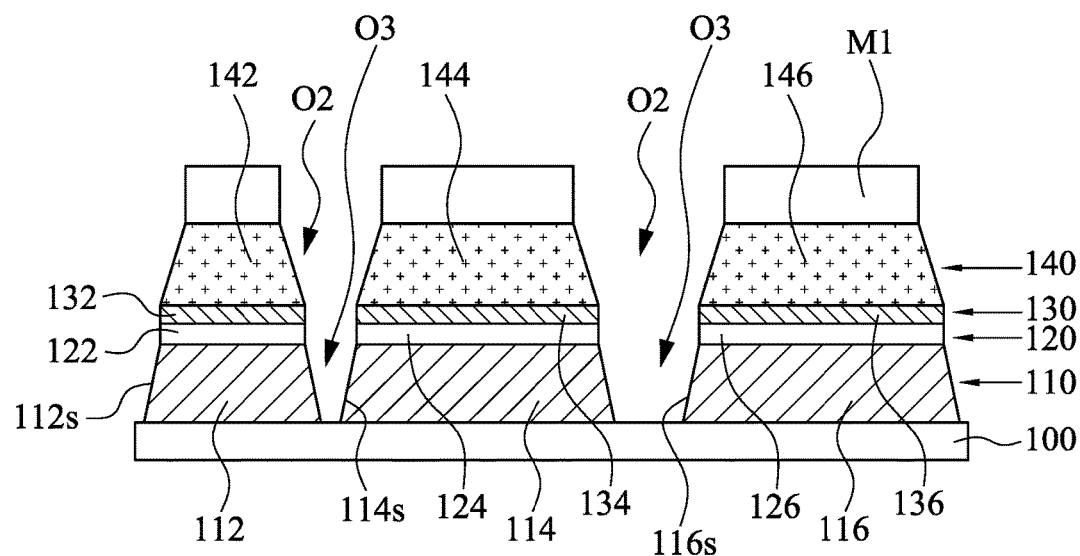

With the pattern of the gate electrode layer 140 including the openings O2 is created, openings O3 corresponding to the openings O2 can be etched into the second conductive layer 130, the dielectric layer 120 and the first conductive layer 110. The resulting structure is shown in FIG. 7. The result of the etching step is that the second conductive layer 130 is patterned into gate pickup regions 132, 134 and 136 respectively under the gate electrodes 142, 144 and 146, the dielectric layer 120 is patterned into dielectric layers 122, 124 and 126 respectively under the gate pickup regions 132, 134 and 136, and the first conductive layer 110 is patterned into source/drain pickup regions 112, 114 and 116 respectively under the dielectric layers 122, 124 and 126. The gate pickup regions 132, 134 and 136 are separated by the openings O3, the dielectric layers 122, 124 and 126 are separated by the openings O3, and the source/drain pickup regions 112, 114 and 116 are separated by the openings O3 as well.

In some embodiments, the etching step includes one or more etching processes. For example, a first etching process is carried out to pattern the second conductive layer 130 and is stopped by the dielectric layer 120 (also referred to as ESL), and a second etching process is then carried out to pattern the dielectric layer 120 and the underlying first conductive layer 110. The etching process may be, for example, Reactive Ion Etching (RIE), chemical etching, the like, or combinations thereof. Other patterning techniques may be used. In some embodiments, the hard mask M1 is removed using suitable etching techniques after the etching step. In some other embodiments, the hard mask M1 is consumed during the etching step, and top surfaces of the gate electrodes 142, 144 and 146 are exposed.

Due to nature of the one or more etching processes, the openings O3 taper toward the underlying substrate 100, thus creating the source/drain pickup regions 112, 114 and 116 in conical frustum shapes. For example, the source/drain pickup regions 112, 114 and 116 taper in a direction farther away from the substrate 100. As illustrated, the source/drain pickup regions 112, 114 and 116 include sloped sidewalls 112s, 114s and 116s inclined with respect to a top surface of the substrate 100. Such conical frustum shapes may be beneficial to increase contact area between the source/drain pickup region and a subsequently formed source/drain contact.

Figure 8:
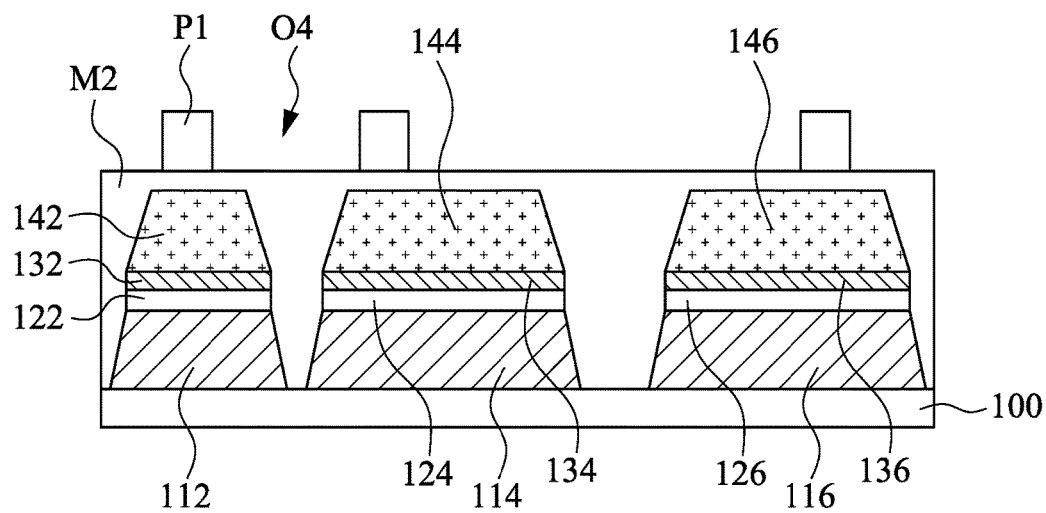

Reference is made to FIG. 8. Another hard mask layer M2 is formed over the gate electrode layer 140, and a photoresist layer is formed over the hard mask layer M2 and then patterned to form a photoresist mask P1 with openings O4 using suitable photolithography techniques. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof, so as to form a patterned photoresist mask P1 over the hard mask layer M2. In some embodiments, the hard mask M2 is TiN, SiN, amorphous silicon, the like, or combinations thereof.

Figure 9:
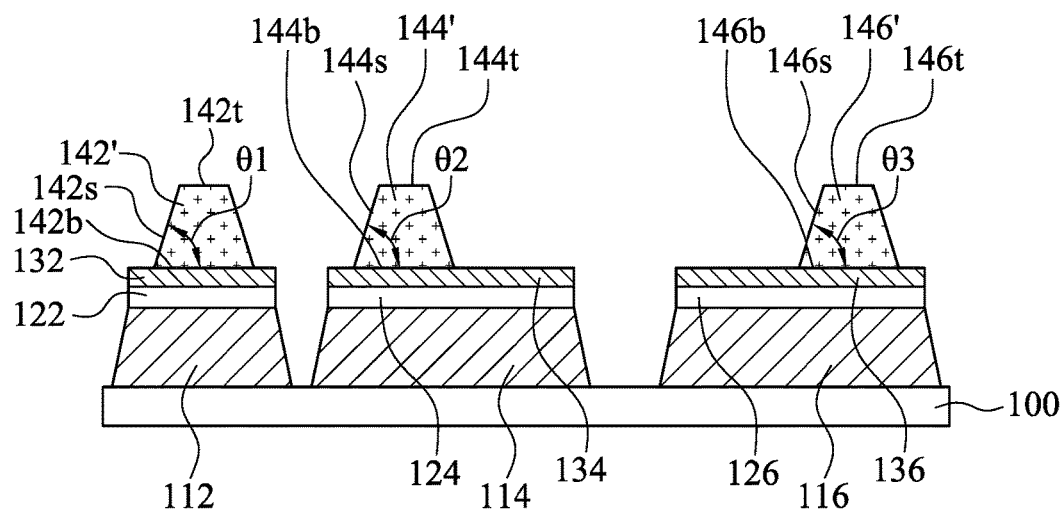

After the photolithography process, the hard mask layer M2 can be patterned using the photoresist mask P1 as a mask, and an etching process is performed to remove portions of the gate electrodes 142, 144 and 146 using the patterned hard mask layer M2 as a mask, so that geometries of gate electrodes 142, 144 and 146 can be modified to form gate electrodes 142', 144' and 146' with desired conical frustum shapes. The hard mask layer M2 and the photoresist mask P1 are removed. The resulting structure is illustrated in FIG. 9. In some embodiments, the etching process suitable for modifying geometries of the gate electrode layer 140 may be dry etching using an etching gas such as $CF_4$, Ar, $NF_3$, $Cl_2$, He, HBr, $O_2$, $N_2$, $CH_3F$, $CH_4$, $CH_2F_2$, or combinations thereof.

In the illustration, the gate electrodes 142', 144' and 146' taper in a direction farther away from the substrate 100. As illustrated, the gate electrodes 142', 144' and 146' include sloped sidewalls 142s, 146s and 146s inclined with respect to bottom surfaces 142b, 144b and 146b of the gate electrodes 142', 144' and 146'. For example, the sloped sidewall 142s coincides with the bottom surface 142b, and they define an acute angle θ1 therebetween, so that a top surface 142t of the gate electrode 142' has a width less than a width of the bottom surface 142b. Similarly, the sloped sidewall 144s and the bottom surface 144b define an acute angle θ2 therebetween, so that a top surface 144t of the gate electrode 144' has a width less than a width of the bottom surface 144b. In a similar fashion, the sloped sidewall 146s and the bottom surface 146b define an acute angle θ3 therebetween, so that a top surface 146t of the gate electrode 146' has a width less than a width of the bottom surface 146b.

In some embodiments, the acute angles θ1, θ2 and θ3 may be in a range from about 60 degrees to about 90 degrees, so that the gate electrodes 142', 144' and 146' can be formed in desired conical frustum shapes. In some embodiments, the acute angles θ1, θ2 and θ3 are different from each other. In some embodiments, the acute angles θ1, θ2 and θ3 are the same. In some embodiments, the acute angles θ1, θ2 and θ3 can be controlled by etching conditions, such as etching gas, temperature, over etching (OE) time, the like, or combinations thereof.

Since the conical frustum-shaped gate electrodes 142', 144' and 146' include sloped sidewalls 142s, 144s and 146s rather than vertical sidewalls, gate contacts formed in a subsequent process can land either on the sloped sidewalls 142s, 144s, 146s or on the gate pickup regions 132, 134, 136. As a result, the conical frustum-shaped gate electrodes 142', 144', and 146' can provide improved flexibility for forming gate contacts. Moreover, the sloped sidewalls 142s, 144s, and 146s can provide increased contact area compared to horizontal top surfaces of the gate pickup regions 132, 134 and 134, and hence the conical frustum-shaped gate electrodes 142', 144', and 146' may also benefit reduction of the contact resistance of the gate contacts.

Figure 10:
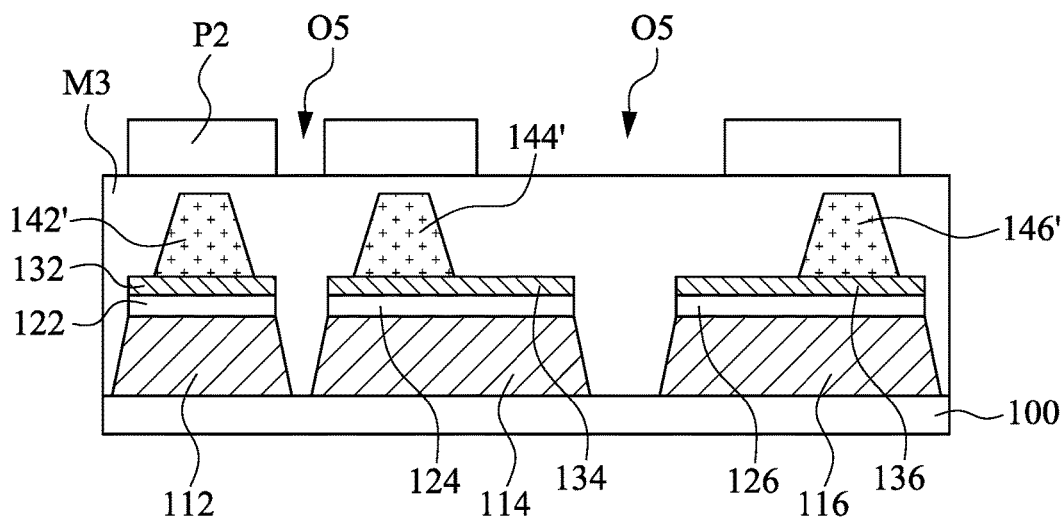

Reference is made to FIG. 10. Another hard mask layer M3 is formed over the substrate 100, and a photoresist layer is formed over the hard mask layer M3 and then patterned to form a photoresist mask P2 with openings O5 using suitable photolithography techniques as discussed above. In some embodiments, the hard mask layer M3 is TiN, SiN, amorphous silicon, the like, or combinations thereof.

Figure 11:
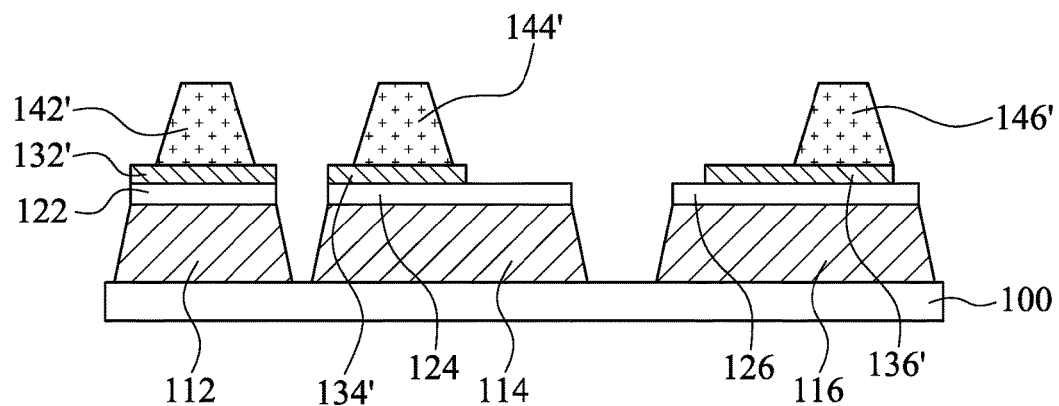

After the photolithography process, the hard mask layer M3 can be patterned using the photoresist mask P2 as a mask, and an etching process is performed to remove portions of the gate pickup regions 132, 134 and 136 using the patterned hard mask layer M3 as a mask, so that gate pickup regions 132, 134 and 136 can be modified to form gate pickup regions 132', 134' and 136' with desired sizes. The patterned hard mask layer M3 and the photoresist mask P2 are then removed. The resulting structure is illustrated in FIG. 11. The etching process may be an RIE process, a chemical etching process, the like, or combinations thereof.

Figure 12:
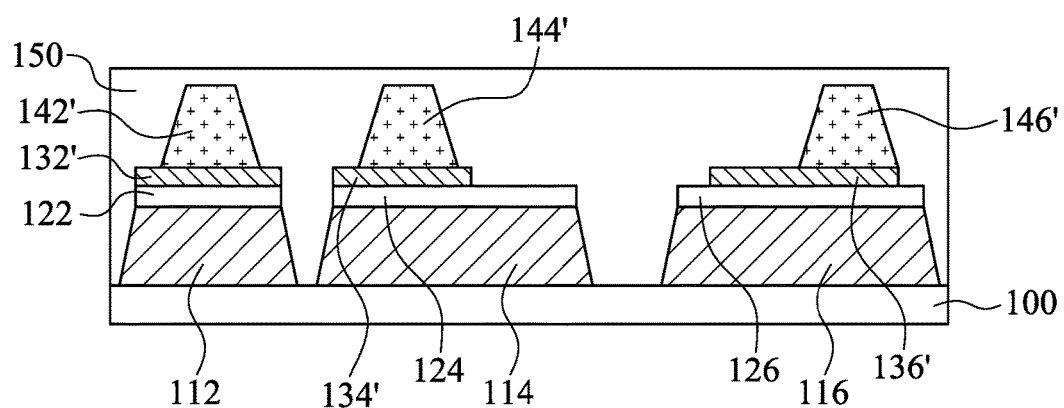

Reference is made to FIG. 12. A dielectric layer 150 is formed on the gate electrodes 142', 144', 146', the gate pickup regions 132', 134' 136', the dielectric layers 122, 124, 126, the source/drain pickup regions 112, 114, 116 and the substrate 100. The dielectric layer 150 can be formed by an appropriate deposition technique, such as CVD, PECVD, spin-on, the like, or combinations thereof, and can be formed of a dielectric material such as porous dielectric, silicon oxide, PSG, BSG, BPSG, USG, nitride, oxynitride, the like, or combinations thereof.

Figure 13:
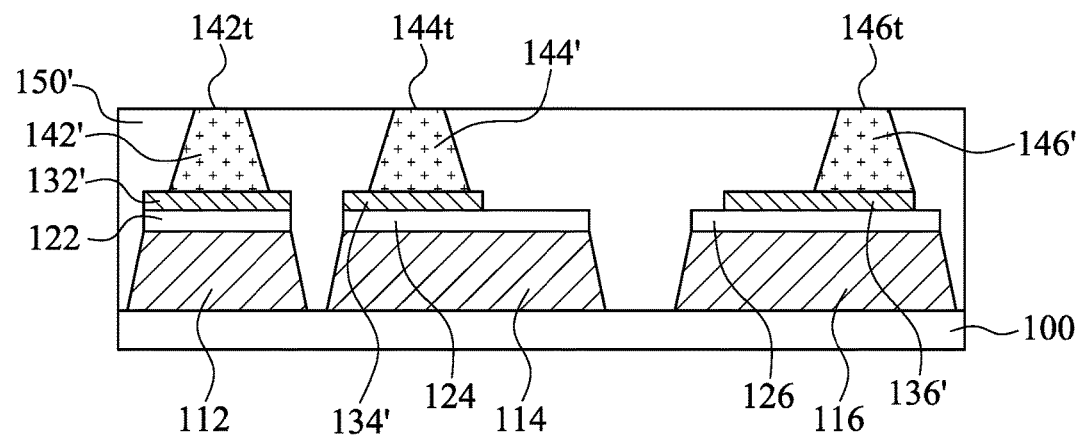

A chemical mechanical polish (CMP) process may be then performed to planarize the dielectric layer 150 as a dielectric layer 150' with a substantially planar top surface. The resulting structure is shown in FIG. 13. The planarized dielectric layer 150' has a top surface substantially level with top surfaces 142t, 144t and 146t of the gate electrodes 142', 144' and 146'.

Figure 14:
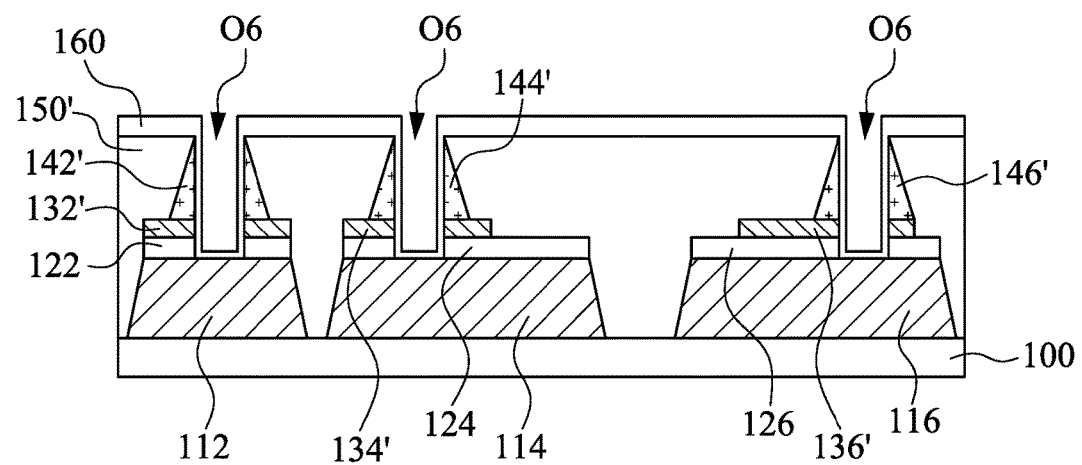

Thereafter, the gate electrodes 142', 144' and 146' are etched to form through holes O6, as illustrated in FIG. 14. One through hole O6 is formed through the gate electrode 142', the gate pickup region 132', the dielectric layer 122 to the source/drain pickup region 112. Another through hole O6 is formed through the gate electrode 144', the gate pickup region 134', the dielectric layer 124 to the source/drain pickup region 114. Another through hole O6 is formed through the gate electrode 146', the gate pickup region 136', the dielectric layer 126 to the source/drain pickup region 116. At portions of the source/drain pickup region 112, 114 and 116 are exposed by the through holes O6. The through hole O6 may be formed by using an acceptable photolithography and etching process, such as RIE, isotropic plasma etching, or the like.

Next, a gate dielectric layer 160 is blanket formed over the dielectric layer 150' and into the through hole O6. The gate dielectric layer 160 includes substantially vertical portions lining sidewalls of the through holes O6 and substantially horizontal portions in contact with exposed portions of the source/drain pickup regions 112, 114, 116 and the top surface of the dielectric layer 150'. In some embodiments, the gate dielectric layer 160 comprises silicon oxide, silicon nitride, the like, or multilayers thereof. In other embodiments, the gate dielectric layer 160 comprises a high-k dielectric material, and in these embodiments, the gate dielectric 160 may have a k value greater than about 7.0, and may include a metal oxide or a silicate of Hf, Al, Zr, La, Mg, Ba, Ti, Zr, Lu, the like, or combinations thereof. The gate dielectric layer 160 may be deposited by ALD, Molecular-Beam Deposition (MBD), PECVD, the like, or combinations thereof. In some embodiments where the gate dielectric layer 160 is formed using ALD, a temperature during the ALD process may be in a range from about 177° C. to about 325° C.

Figure 15:
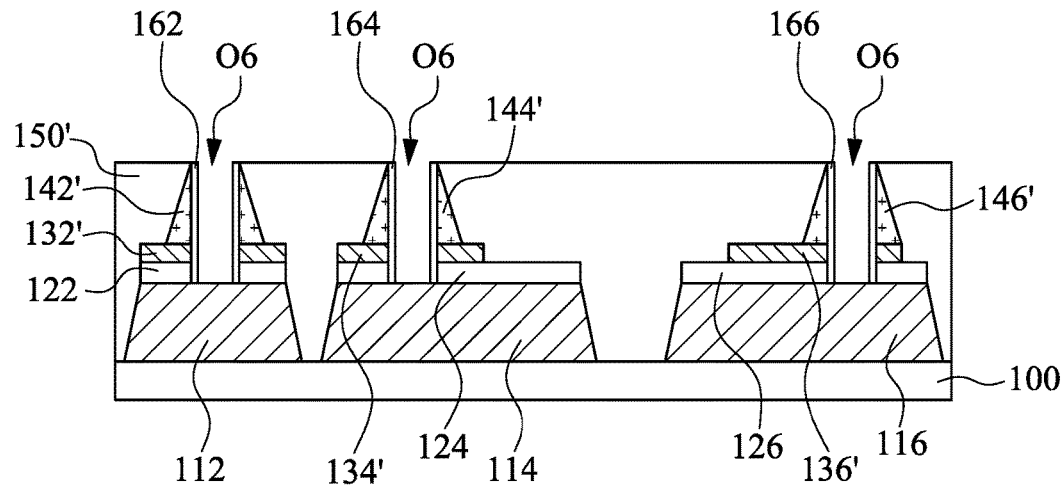

Next, as shown in FIG. 15, an appropriate etching process, such as an anisotropic etch like plasma etching, RIE, or the like, can be used to remove substantially horizontal portions of the gate dielectric layer 160 such that substantially vertical portions of the gate dielectric layer 160 remain in the through holes O6 to form the gate dielectric layers 162, 164 and 166 along the sidewalls of the through holes O6, respectively. After the substantially horizontal portions of the gate dielectric layer 160 are removed, at least respective portions of the source/drain pickup regions 112, 114 and 116 are exposed through the through holes O6.

Figure 16:
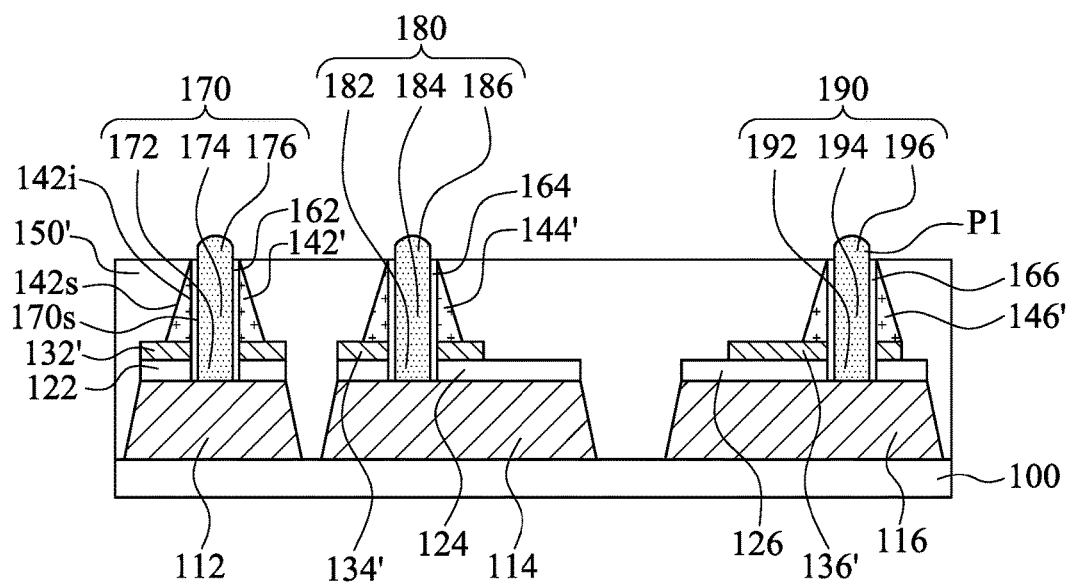

Thereafter, a metal-containing material is deposited in the through holes O6 to form nanowires 170, 180 and 190 in the respective through holes O6, and the resulting structure is illustrated in FIG. 16. The metal containing material may be, for example, CoB, CoP, WB, WB, In$_2$O$_3$, the like, or combinations thereof. The metal-containing material can be deposited using a bottom-up deposition process, such as electroless deposition (ELD), plasma enhanced ALD (PEALD), the like, or combinations thereof. In some embodiments where the metal-containing material is deposited using an ELD process, the ELD process can provide a low process temperature (e.g. ranging from about 45° C. to about 70° C.), an intrinsic process selectivity and conformal bottom-up deposition to reduce gap-fill challenge, so that the through holes O6 can be properly filled by the metal-containing material. For example, a minimal diameter of the through hole O6 that can be filled using the ELD process is about 10 nm. The metal-containing material can be doped with an n-type dopant or a p-type dopant during the bottom-up deposition of the metal-containing material, e.g., in situ. Therefore, in some embodiments, bottom, middle and top regions of each nanowire can have different dopant concentrations because they are formed in sequence.

In some embodiments, each nanowire and corresponding one of gate electrodes in combination form a junctionless transistor. For example, the nanowire 170 surrounded by the gate electrode 142' includes source/drain regions 172 and 176 at bottom and top ends thereof and a channel region 174 between the source/drain regions 172 and 176, the source/drain regions 172, 176 and the channel region 174 may comprise the same n-type dopant (e.g. phosphorus) or p-type dopant (e.g. boron), and there is no P-N junction or N-P junction between the source/drain regions 172, 176 and the channel region 174. In some embodiments, the junctionless transistor may be in the "ON" state when fabricated, and the gate electrode 142' of the junction transistor can be used to provide an electric field that is able to deplete the channel region 174 thereby shutting off the transistor. In some embodiments, the dopant concentration of the source/drain regions 172, 176 is different from the dopant concentration of the channel region 174 so as to improve performance of the junctionless transistor. For example, the dopant concentration of the source/drain regions 172, 176 can be higher than the dopant concentration of the channel region 174, and vice versa.

Similarly, the nanowire 180 surrounded by the gate electrode 144' includes source/drain regions 182 and 186 at bottom and top ends thereof and a channel region 184 between the source/drain regions 182 and 186, the source/drain regions 182, 186 and the channel region 184 may comprise the same n-type or p-type dopant, and there is no P-N junction or N-P junction between the source/drain regions 182, 186 and the channel region 184. In a similar fashion, the nanowire 190 surrounded by the gate electrode 146' includes source/drain regions 192 and 196 at bottom and top ends thereof and a channel region 194 between the source/drain regions 192 and 196, the source/drain regions 192, 196 and the channel region 194 may comprise the same n-type or p-type dopant, and there is no P-N junction or N-P junction between the source/drain regions 192, 196 and the channel region 194.

In the depicted embodiments, the sloped sidewall 142$s$ of the gate electrode 142' is inclined with respect to a substantially vertical sidewall 170$s$ of the nanowire 170. For example, the substantially vertical sidewall 170$s$ is non-parallel to the sloped sidewall 142$s$. For example, the sloped sidewall 142$s$ is oriented at an acute angle relative the substantially vertical sidewall 170$s$ of the nanowire 170. Similarly, the sloped sidewalls of the gate electrodes 144' and 146' are inclined with respect to sidewalls of the respective nanowires 180 and 190. Such orientation of the sloped sidewalls of gate electrodes 142', 144' and 146' provides either improved flexibility of forming gate contacts or increased contact area for the gate contacts.

In the depicted embodiments, the gate dielectric layer 162 is between the gate electrode 142' and the nanowire 170. For example, the nanowire 170, the gate dielectric layer 162 and the gate electrode 142 are concentrically arranged, wherein the gate dielectric layer 162 surrounds and in contact with the nanowire 170, and the gate electrode 142' surrounds and in contact with the gate dielectric layer 162. The gate electrode layer 142' has an inner sidewall 142$i$ between the sloped sidewall 142$s$ and the nanowire 170. The inner sidewall 142$i$ is substantially parallel to the sidewall 170$s$ of the nanowire 170, and hence the sloped sidewall 142$s$ is inclined with respect to the inner sidewall 142$i$. In some embodiments, the inner sidewall 142$i$ of the gate electrode 142' is in contact with the gate dielectric layer 162, and hence the inner sidewall 142$i$ can also be referred to as an outer sidewall of the gate dielectric layer 162 that is non-parallel to the sloped sidewall 142$s$. The nanowire 180, the gate dielectric layer 164 and the gate electrode 144' may be arranged in a similar fashion as described above, and the nanowire 190, the gate dielectric layer 166 and the gate electrode 146' may be also arranged in a similar fashion as described above.

Figure 17:
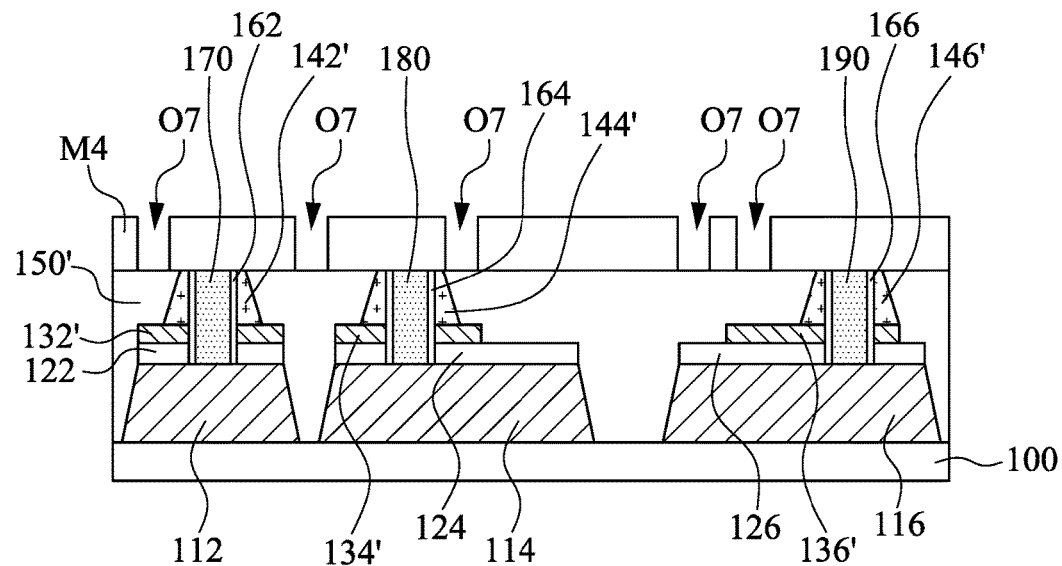

In some embodiments where the metal-containing material is deposited using ELD, the metal-containing material may overfill the through holes O6 to form spherical structures P1 protruding above the dielectric layer 150'. In some embodiments, the spherical structures P1 are removed using a CMP process, as illustrated in FIG. 17. In some other embodiments, these spherical structures P1 remain in a final product.

Reference is made to FIG. 17. Another mask layer is formed over the dielectric layer 150' and then patterned to form a mask M4 with openings O7 using suitable photolithography and/or etching processes, as example. In some embodiments, the mask M4 is photoresist, TiN, SiN, amorphous silicon, the like, or combinations thereof.

Figure 18:
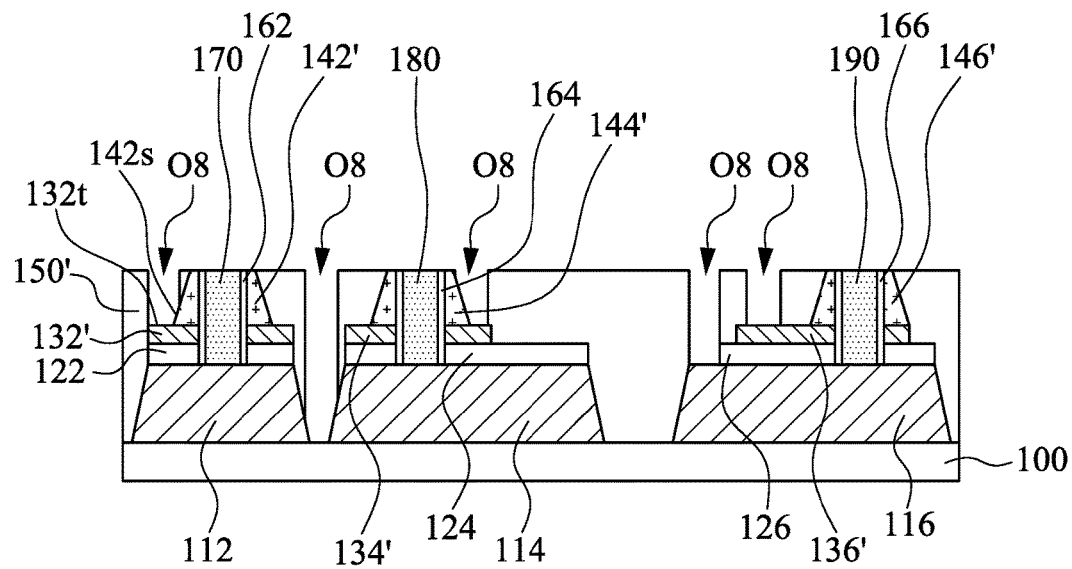

With the pattern of the mask M4 including the openings O7 is created, contact holes O8 corresponding to the openings O7 can be etched into the dielectric layer 150'. The resulting structure is illustrated in FIG. 18. Top surface 132t of the gate pickup region 132' and the sloped sidewall 142s of the gate electrode 142' are exposed by one contact hole O8. Opposed sloped sidewalls of the neighboring source/drain pickup regions 112 and 114 are exposed by another contact hole O8. Top surface of the source/drain pickup region 116 is exposed by another contact hole O8. Top surface of the gate pickup region 136' is exposed by another contact hole O8. After formation of the contact holes O8, the mask M4 is removed.

Figure 19:
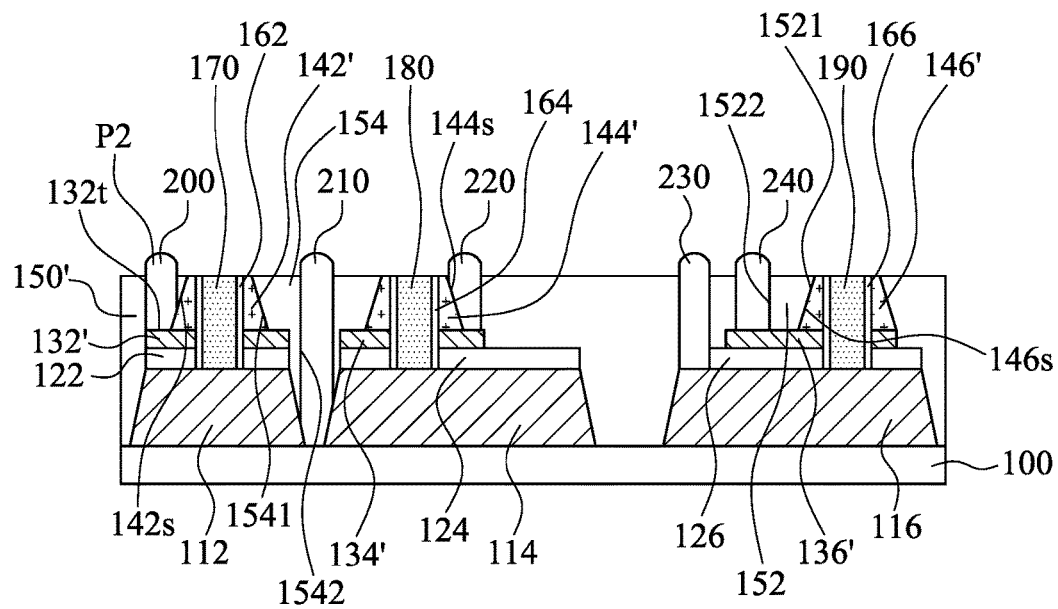
Figure 21:
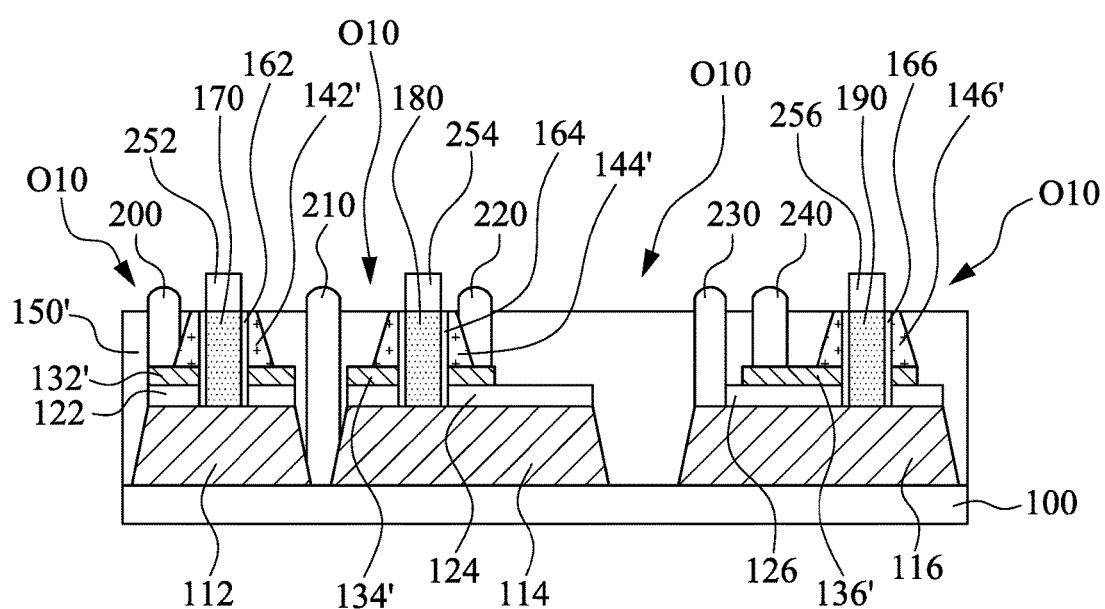

Thereafter, gate contacts 200, 220, 240 and source/drain contacts 210 and 230 are formed in the contact holes O8, respectively, and the resulting structure is shown in FIG. 19. The gate contacts 200, 220, 240 and source/drain contacts 210 and 230 may be, for example, ruthenium, bismuth, tungsten, the like, or combinations thereof. The gate contacts 200, 220, 240 and source/drain contacts 210 and 230 can be deposited using a bottom-up deposition process, such as electroless deposition (ELD), plasma enhanced ALD (PEALD), the like, or combinations thereof. In some embodiments where the metal-containing material is deposited using an ELD process, the ELD process can provide a low process temperature (e.g. ranging from about 30° C. to about 100° C.), an intrinsic process selectivity and conformal bottom-up deposition to reduce gap-fill challenge, so that the contact holes O8 can be properly filled by the metal-containing material. In some embodiments where these contacts 200, 210, 220, 230 and 240 are deposited using ELD, the material may overfill the contact holes O8 to form spherical structures P2 protruding above the dielectric layer 150'. In some embodiments, these spherical structures P2 remain in a final product, as illustrated in FIG. 21. In some other embodiments, the spherical structures P2 are removed using a CMP process.

In some embodiments, the gate contact 200 is in contact with the gate pickup region 132' and the sloped sidewall 142s of the gate electrode 142'. Therefore, the sloped sidewall 142s can provide additional region on which the gate contact 200 lands. Moreover, the sloped sidewall 142s can provide increased contact area for the gate contact 200 to reduce the contact resistance. The source/drain contact 210 is in contact with opposed sloped sidewalls of the neighboring source/drain pickup regions 112 and 114, and hence the contact area can be increased and the contact resistance is thus reduced. The gate contact 220 is in contact with the gate pickup region 134' and the sloped sidewall 144s of the gate electrode 144'. The source/drain contact 230 is in contact with the top surface of the source/drain pickup region 116. The gate contact 240 is in contact with the top surface of the gate pickup region 136'.

In some embodiments, the gate pickup region 132' is under the in contact with the gate electrode 142', and the sloped sidewall 142s is inclined with respect to the top surface 132t of the gate pickup regions 132'. Moreover, the gate contact 200 is in contact with the sloped sidewall 142s of the gate electrode 142' and the top surface 132t of the gate pickup region 132'. In some embodiments, the gate pickup region 132' laterally extends across the sloped sidewall 142s of the gate electrode 142' and is in contact with a bottom edge of the sloped sidewall 142s, and hence the gate pickup region 132' has a portion not overlapped with the gate electrode 142'. The gate contact 200 is in contact with this portion of the gate pickup region 132' and the sloped sidewall 142s of the gate electrode 142'.

In some embodiments, the dielectric layer 150' has various portions each between a gate electrode and a corresponding one of the gate contacts. For example, the dielectric layer 150' includes a dielectric structure 152 with opposite first and second sidewalls 1521 and 1522. The first sidewall 1511 is in contact with the sloped sidewall 146s of the gate electrode 146', and the second sidewall 1522 is in contact with the gate contact 240. The first sidewall 1511 is inclined with the second sidewall 1522 due to incline of the sloped sidewall 146s.

In some embodiments, the source/drain contact 210 is in contact with the source/drain pickup region 112 that is under the nanowire 170 and electrically isolated from the gate electrode 142'. The dielectric layer 150' includes a dielectric structure 154 between the sloped sidewall 142s of the gate electrode 142' and the source/drain contact 210. The dielectric structure 154 has opposite first and second sidewalls 1541 and 1542. The first sidewall 1541 is in contact with the sloped sidewall 142s of the gate electrode 142', and the second sidewall 1542 is in contact with the source/drain contact 210. The first sidewall 1541 is inclined with the second sidewall 1542 due to incline of the sloped sidewall 142s.

Figure 20:
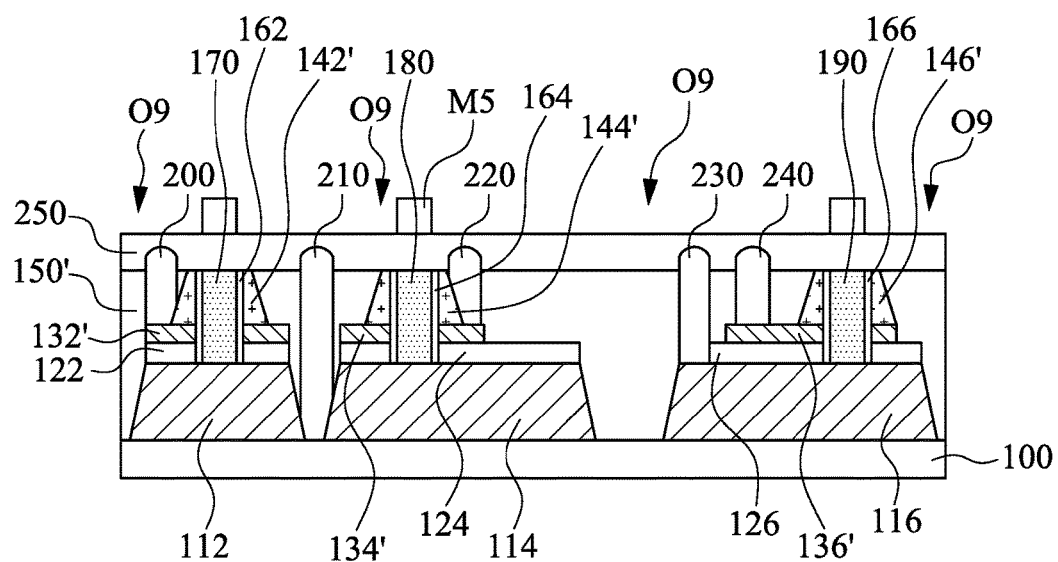

Reference is made to FIG. 20. A third conductive layer 250 is formed over the dielectric layer 150', the contacts 200, 210, 220, 230, 240 and the nanowires 170, 180 and 190 using suitable deposition techniques. The third conductive layer 250 may be copper, tungsten, the like, or combinations thereof. Another mask layer is formed over the dielectric layer 150' and then patterned to form a mask M5 with openings O9 using suitable photolithography and/or etching processes, as example. In some embodiments, the mask M5 is photoresist, TiN, SiN, amorphous silicon, the like, or combinations thereof.

With the pattern of the mask M5 including the openings O9 is created, openings O10 corresponding to the openings O9 can be etched into the third conductive layer 150, so that the third conductive layer 250 can be patterned into source/drain contacts 252, 254 and 256 respectively on top ends of the nanowires 170, 180 and 190. The resulting structure is illustrated in FIG. 21.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the conical frustum-shaped gate electrodes with sloped sidewalls can provide improved flexibility for forming gate contacts. Another advantage is that the conical frustum-shaped gate electrodes with sloped sidewalls can provide increased contact area for gate contacts. Yet another advantage is that the conical frustum-shaped source/drain pickup regions with sloped sidewall can provide increased contact area for source/drain contacts.

In some embodiments, a device comprises a nanowire, a gate dielectric layer and a gate electrode. The nanowire has a sidewall. The gate dielectric layer surrounds the nanowire.

The gate electrode surrounds the gate dielectric layer and is separated from the nanowire. The gate electrode comprises a sloped sidewall inclined with respect to the sidewall of the nanowire.

In some embodiments, a device comprises a conical frustum-shaped gate electrode, a nanowire and a gate dielectric layer. The nanowire extends through the conical frustum-shaped gate electrode. The nanowire comprises a sidewall non-parallel to an outer sidewall of the conical frustum-shaped gate electrode. The gate dielectric layer is between the conical frustum-shaped gate electrode and the nanowire.

In some embodiments, a method comprises forming a gate electrode layer over a substrate, patterning the gate electrode layer to form a conical frustum-shaped gate electrode, forming a through hole in the conical frustum-shaped gate electrode, forming a gate dielectric layer lining a sidewall of the through hole in the conical frustum-shaped gate electrode, and forming a nanowire in the through hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a nanowire having a sidewall;
   a gate dielectric layer surrounding the nanowire; and
   a gate electrode surrounding the gate dielectric layer and separated from the nanowire, the gate electrode comprising a sloped sidewall inclined with respect to the sidewall of the nanowire, the sloped sidewall of the gate electrode having a bottom edge in a position higher than a bottom surface of the nanowire.

2. The device of claim 1, further comprising:
   a conductive layer under and in contact with the gate electrode, the sloped sidewall of the gate electrode is inclined with respect to a top surface of the conductive layer.

3. The device of claim 2, further comprising:
   a gate contact in contact with the sloped sidewall of the gate electrode and the top surface of the conductive layer.

4. The device of claim 1, further comprising:
   a gate contact in contact with the sloped sidewall of the gate electrode.

5. The device of claim 1, further comprising:
   a conductive layer laterally extending across the sloped sidewall of the gate electrode and in contact with the bottom edge of the sloped sidewall.

6. The device of claim 5, further comprising:
   a gate contact in contact with the conductive layer.

7. The device of claim 1, further comprising:
   a gate contact electrically coupled to the gate electrode; and
   a dielectric structure having a first sidewall in contact with the sloped sidewall of the gate electrode and a second sidewall in contact with the gate contact, wherein the first sidewall is inclined with respect to the second sidewall.

8. The device of claim 1, wherein the gate electrode further comprises an inner sidewall between the sloped sidewall and the nanowire, wherein the sloped sidewall is inclined with respect to the inner sidewall.

9. The device of claim 1, wherein the gate electrode further comprises top and bottom surfaces connected by the sloped sidewall, and the top surface has a width less than a width of the bottom surface.

10. The device of claim 1, wherein the gate dielectric layer has an outer sidewall in contact with the gate electrode, wherein the sloped sidewall of the gate electrode is inclined with respect to the outer sidewall of the gate dielectric layer.

11. The device of claim 1, further comprising:
    a conductive layer under the nanowire and electrically isolated from the gate electrode;
    a source/drain contact in contact with the conductive layer; and
    a dielectric structure between the sloped sidewall of the gate electrode and the source/drain contact.

12. The device of claim 11, wherein the dielectric structure has a first sidewall in contact with the sloped sidewall of the gate electrode and a second sidewall in contact with the source/drain contact, wherein the first sidewall is inclined with respect to the second sidewall.

13. A device, comprising:
    a conical frustum-shaped gate electrode;
    a nanowire extending through a bottom surface of the conical frustum-shaped gate electrode, the nanowire comprising a sidewall non-parallel to an outer sidewall of the conical frustum-shaped gate electrode; and
    a gate dielectric layer between the conical frustum-shaped gate electrode and the nanowire.

14. The device of claim 13, wherein the gate dielectric layer comprises a sidewall non-parallel to the outer sidewall of the conical frustum-shaped gate electrode.

15. The device of claim 13, wherein the conical frustum-shaped gate electrode has an inner sidewall non-parallel to the outer sidewall of the conical frustum-shaped gate electrode.

16. The device of claim 13, further comprising:
    a gate contact in contact with the conical frustum-shaped gate electrode.

17. The device of claim 16, further comprising:
    a conductive layer in contact with the bottom surface of the conical frustum-shaped gate electrode, the conductive layer has a portion not overlapped with the conical frustum-shaped gate electrode, and the gate contact is further in contact with the portion of the conductive layer.

18. A device, comprising:
    a conductive layer;
    a gate electrode over the conductive layer;
    a doped nanowire through the conductive layer and the gate electrode; and
    a gate contact having a bottom surface in contact with the conductive layer and a sidewall in contact with the gate electrode, wherein the sidewall of the gate contact is inclined with respect to the bottom surface of the gate contact.

19. The device of claim 18, wherein the gate electrode tapers in a direction away from the conductive layer.

20. The device of claim 18, wherein the doped nanowire comprises a metal-containing material.

* * * * *